United States Patent
Ozaki et al.

(10) Patent No.: US 9,896,764 B2
(45) Date of Patent: Feb. 20, 2018

(54) METHOD FOR PRODUCING SILICEOUS FILM AND POLYSILAZANE COATING TREATMENT LIQUID USED THEREFOR

(75) Inventors: Yuki Ozaki, Shizuoka (JP); Masanobu Hayashi, Shizuoka (JP)

(73) Assignee: Merck Patent GmbH, Darmstadt (DE)

( * ) Notice: Subject to any disclaimer, the term of this patent is extended or adjusted under 35 U.S.C. 154(b) by 73 days.

(21) Appl. No.: 13/391,923

(22) PCT Filed: Sep. 2, 2010

(86) PCT No.: PCT/JP2010/065035
§ 371 (c)(1),
(2), (4) Date: Feb. 23, 2012

(87) PCT Pub. No.: WO2011/027826
PCT Pub. Date: Mar. 10, 2011

(65) Prior Publication Data
US 2012/0156893 A1    Jun. 21, 2012

(30) Foreign Application Priority Data
Sep. 4, 2009 (JP) ................................. 2009-204952

(51) Int. Cl.
| H01L 21/31 | (2006.01) |
| H01L 21/469 | (2006.01) |
| C23C 18/12 | (2006.01) |
| H01L 21/02 | (2006.01) |

(52) U.S. Cl.
CPC ........ *C23C 18/1208* (2013.01); *C23C 18/122* (2013.01); *H01L 21/02164* (2013.01); *H01L 21/02222* (2013.01); *H01L 21/02282* (2013.01); *H01L 21/02326* (2013.01)

(58) Field of Classification Search
CPC .............. C23C 18/1208; C23C 18/122; H01L 21/02222; H01L 21/02282; H01L 21/02164; H01L 21/02326; H01L 21/312; C09D 7/12
USPC ............. 438/782; 257/59, 520, 573, E21.24, 257/E21.545; 427/10, 226, 379, 624
See application file for complete search history.

(56) References Cited

U.S. PATENT DOCUMENTS

| 4,451,969 | A | 6/1984 | Chaudhuri |
| 5,405,655 | A * | 4/1995 | Blum et al. ................... 427/387 |
| 5,530,266 | A * | 6/1996 | Yonehara et al. .............. 257/72 |
| 5,714,790 | A * | 2/1998 | Sakamoto ..................... 257/440 |
| 6,037,275 | A | 3/2000 | Wu et al. |
| 6,318,124 | B1 | 11/2001 | Rutherford et al. |
| 8,263,717 | B2 | 9/2012 | Ozaki |
| 2010/0102321 | A1* | 4/2010 | Abe et al. ....................... 257/59 |
| 2011/0014796 | A1* | 1/2011 | Hayashi ........................ 438/782 |

FOREIGN PATENT DOCUMENTS

| JP | 6-299118 A | 10/1994 |
| JP | 9-31333 A | 2/1997 |
| JP | 9-275135 A | 10/1997 |
| JP | 11116815 A * | 4/1999 |
| JP | 2002-544848 A | 8/2002 |
| JP | 2003-508895 A | 3/2003 |
| JP | 2004-347778 A | 12/2004 |
| JP | 2005-45230 A | 2/2005 |
| JP | 2007096046 A * | 4/2007 |
| JP | 2009-111029 A | 5/2009 |

OTHER PUBLICATIONS

Aoki et al. [Machine Translation of JP 11-116815 A dated Apr. 1999].*
Tanaka et al. [Machine Translation of JP 2007-096046 A dated Apr. 2007].*
H. Schmidt, et al, "Wet Coating Technologies for Glass", The Sol-Gel Gateway, Tutorial (Nov. 2000), pp. 1-14.

* cited by examiner

*Primary Examiner* — Charles Garber
*Assistant Examiner* — Abdulfattah Mustapha
(74) *Attorney, Agent, or Firm* — Francis M. Houlihan

(57) ABSTRACT

The present invention provides a method for forming a siliceous film. According to the method, a siliceous film having a hydrophilic surface can be formed from a polysilazane compound at a low temperature. In the method, a composition containing a polysilazane compound and a silica-conversion reaction accelerator is applied on a substrate surface to form a polysilazane film, and then a polysilazane film-treatment solution is applied thereon so that the polysilazane compound can be converted into a siliceous film at 300° C. or less. The polysilazane film-treatment solution contains a solvent, hydrogen peroxide and an alcohol.

13 Claims, No Drawings ical Patent Application No. PCT/JP2010/065035, filed Sep. 2, 2010, which claims priority to Japanese Patent Application No. 2009-204952, filed Sep. 4, 2009, the contents of which are being hereby incorporated herein by reference.

This invention relates to a siliceous film formation method adopted in manufacture of electronic devices or the like, and also to a polysilazane film-treatment solution used therein. Specifically, the present invention relates to a siliceous film formation method according to which a siliceous film is made from a perhydropolysilazane compound at a low temperature for the purpose of providing an insulating film, a flattened film, a passivation film or a protective film in manufacture of electronic devices or the like; and also to a polysilazane film-treatment solution by use of which it becomes possible to realize the above siliceous film formation at a low temperature.

BACKGROUND ART

In an electronic device such as a semiconductor element, semiconductor parts such as transistors, resistors and the like are arranged on a substrate. Those parts must be electrically isolated from each other, and hence have been two-dimensionally placed apart from each other on the substrate. However, according as the requirement of high-density interconnection, they are nowadays becoming placed three-dimensionally. Specifically, it is getting popular to adopt an electronic device manufacturing process comprising the steps of: placing semiconductor parts two-dimensionally on a substrate; forming a layer of insulating film thereon; and providing other parts on the layer, to produce a multilayer structure.

As a method for forming the above insulating film, there is known a process comprising the steps of: applying a coating composition containing polysilazane, and then curing the formed film to convert the polysilazane into a siliceous film (see, for example, Patent documents 1 to 3).

PRIOR ART DOCUMENTS

[Patent document 1] Japanese Patent Laid-Open No. 9(1997)-31333
[Patent document 2] Japanese Patent Laid-Open No. 9(1997)-275135
[Patent document 3] Japanese Patent Laid-Open No. 2005-45230
[Patent document 4] Japanese Patent Laid-Open No. 6(1994)-299118
[Patent document 5] Japanese Patent Laid-Open No. 11(1999)-116815
[Patent document 6] Japanese Patent Laid-Open No. 2009-111029

DISCLOSURE OF INVENTION

Problem to be Solved by the Invention

The composition containing polysilazane is generally required to be applied and then cured at a high temperature. However, according to the present inventors' study, the treatment at a high temperature often lowers the production efficiency. Further, the more layers the device comprises, the more repeatedly the treatment must be carried out at a high temperature. Consequently, the productivity of the device is much more impaired. In view of this problem, it is studied to employ a silica-conversion reaction accelerator, which contributes to the conversion reaction of polysilazane into a siliceous film, so as to avoid the treatment at a high temperature (see, for example, Patent documents 4 to 6).

However, the present inventors have found that the resultant siliceous film is often made to have a hydrophobic surface by the silica-conversion reaction accelerator. Accordingly, when the coating composition necessary for providing semiconductor parts is applied on that siliceous film, the surface of the film tends to repel the composition to cause coating ununiformity or failure.

This is room for improvement.

Means for Solving Problem

The present invention resides in a siliceous film formation method comprising
a polysilazane-film formation step, in which a composition containing a polysilazane compound and a silica-conversion reaction accelerator is applied on a substrate surface to form a polysilazane film;
a promoter application step, in which a polysilazane film-treatment solution is applied on said polysilazane film; and
a hardening step, in which said polysilazane compound is converted into a siliceous film at a temperature of 300° C. or less;
wherein
said polysilazane film-treatment solution contains a solvent, 0.5 to 10 wt % of hydrogen peroxide and 10 to 98 wt % of an alcohol, based on the total weight thereof.

The present invention also resides in a poly silazane film-treatment solution
which is applied on a polysilazane film formed by applying a composition containing a polysilazane compound and a silica-conversion reaction accelerator, so as to promote conversion of the polysilazane compound into silica;
characterized by
containing a solvent, 0.5 to 10 wt % of hydrogen peroxide and 10 to 98 wt % of an alcohol, based on the total weight thereof.

Effect of the Invention

The present invention enables to easily form a dense siliceous film at a relatively low temperature, for example, at room temperature, as compared with conventional siliceous film formation methods. Accordingly, the present invention can be adopted in manufacture of electronic devices having semiconductor parts of poor heat resistivity. In a conventional method such as a low-temperature curing process, a siliceous film is made from perhydropolysilazane and has a hydrophobic surface. In fact, when another coating composition is applied thereon, the film surface often repels the composition. However, since the present invention provides a hydrophilic siliceous film, it becomes possible to avoid repelling on the film surface. The siliceous film formed according to the present invention, therefore, can be employed as an interlayer insulating film, a top protective film, a primer for protective coating or the like in an electronic device. Further, the siliceous film of the present invention is not restricted to be used in an electronic device, but also usable as a surface protective film on a substrate made of metal, glass, plastics or the like.

BEST MODE FOR CARRYING OUT THE INVENTION

Embodiments of the present invention are described below in detail.

Polysilazane Film-Treatment Solution

The polysilazane film-treatment solution used in the present invention is applied on a polysilazane film before the film is hardened in the siliceous film formation method described later. Specifically, the polysilazane film-treatment solution of the present invention is cast on a polysilazane film before the film is hardened, and thereby the siliceous film formation method according to the present invention makes it possible to produce a siliceous film at a temperature lower than conventional methods.

The polysilazane film-treatment solution of the present invention contains hydrogen peroxide, an alcohol and a solvent. Those components are explained below in order.

(a) Hydrogen Peroxide

Hydrogen peroxide is generally well known as an oxidizing agent. In the present invention, the siliceous film formation is presumed to be achieved by the combination of hydrogen peroxide and a silica-conversion reaction accelerator contained in the polysilazane film.

Since pure $H_2O_2$ in itself is an unstable liquid, hydrogen peroxide is generally handled in the form of an aqueous solution. In the present invention, therefore, normally an aqueous solution of hydrogen peroxide is used to prepare the polysilazane film-treatment solution. Preferably, the hydrogen peroxide aqueous solution is mixed with the treatment solution to obtain the aimed concentration of hydrogen peroxide. Instead of the aqueous solution, hydrogen peroxide freshly formed, for example, by electrolysis of an ammonium hydrogen sulfate aqueous solution or by hydrolysis of a peroxy acid may be directly added into the treatment solution. However, it is much easier to use the aqueous solution.

The polysilazane film-treatment solution contains hydrogen peroxide preferably in an amount large enough to form an even fired film. On the other hand, however, in consideration of ensuring safety of workers handling the treatment solution, the amount of hydrogen peroxide is preferably less than a particular value. From those points of view, the content of hydrogen peroxide is necessarily 0.5 to 10 wt %, preferably 1 to 8 wt %, more preferably 3 to 5 wt %, based on the total weight of the solution.

(b) Alcohol

It is essential for the polysilazane film-treatment solution of the present invention to contain an alcohol. In the present invention, the alcohol has a function of making the formed siliceous film has a hydrophilic surface. Because of this function, the present invention can provide a siliceous film with more hydrophilic characteristic than conventional methods. Accordingly, when another composition is applied on the surface thereof, it is possible to form another film more uniformly than ever.

In the present invention, the term "alcohol" means a substance whose molecular structure is characterized in that at least one hydrogen included in a hydrocarbon is replaced with a hydroxyl group. From the viewpoints of treatability and of improving hydrophilicity of the siliceous film surface, the alcohol is preferably selected from the group consisting of monools, diols and oxyethers each of which has 1 to 8 carbon atoms. There are many kinds of alcohols, which can be categorized in terms of, for example, the kind of hydrocarbon chain and the position of hydroxyl group. However, it is desired for the alcohol to considerably improve hydrophilicity of the formed siliceous film surface, to have a boiling point low enough not to remain on the formed siliceous film, and to hardly react with other components such as hydrogen peroxide. In view of those, the alcohol is preferably selected from the group consisting of: aliphatic alcohols such as, methanol, ethanol, n-propanol, iso-propanol, butanol, hexanol and octanol; aliphatic diols such as, ethylene glycol and propylene glycol; oxyethers such as, 1-methoxy-2-propanol and 2-ethoxyethanol; and mixtures thereof.

The polysilazane film-treatment solution contains the alcohol preferably in an amount large enough to improve hydrophilicity of the siliceous film. On the other hand, however, since hydrogen peroxide is normally incorporated in the form of an aqueous solution in the present invention, water of the aqueous solution restricts the upper limit of the alcohol content. From those points of view, the content of the alcohol is necessarily 10 to 98 wt %, preferably 20 to 98 wt %, more preferably 25 to 98 wt %.

(c) Solvent

The polysilazane coat-treatment solution of the present invention contains a solvent, which has a function of homogeneously dissolving the above alcohol and hydrogen peroxide. Although the alcohol described above is a liquid and hence can generally serve as a solvent, the term "solvent" in the present invention does not include alcohols. In other words, the "solvent" used in the present invention is selected from substances other than alcohols.

The solvent can be freely selected as long as it can dissolve the above components homogeneously, but preferred is water. It is particularly preferred to adopt water of high purity, such as distilled water or deionized water, so as to prevent impurities from attaching on the substrate. If hydrogen peroxide or an optional surfactant is incorporated in the form of an aqueous solution, the solvent thereof (namely, water) can serve as the solvent of the polysilazane film-treatment solution according to the present invention.

(d) Other Components

In addition to the indispensable components described above, the polysilazane film-treatment solution of the present invention may contain optional components according to necessity. Examples of the optional components include: surfactants, which are for improving coatability and/or bubble adhesion; and ethers, ketones, aldehydes and carboxylic acids, which are for improving compatibility of the components.

The above components are mixed and homo generously dissolved to prepare the polysilazane film-treatment solution of the present invention. In this preparation, there is no particular restriction on the order of addition of the components. The prepared treatment solution should be kept in a dark and cool place because it contains hydrogen peroxide, which is relatively unstable.

Formation of Siliceous Film

The siliceous film formation method of the present invention comprises the steps of: (a) applying a composition containing a polysilazane compound and a silica-conversion reaction accelerator (hereinafter, often simply referred to as "accelerator") on a substrate surface, to form a polysilazane film; (b) applying a polysilazane film-treatment solution (hereinafter, often simply referred to as "treatment solution") on the polysilazane film; and (c) converting the polysilazane compound into a siliceous film at a temperature of 300° C. or less.

(a) Polysilazane-Film Formation Step

There is no particular restriction on the material of the substrate. Examples of the substrate include a prime silicon substrate and a silicon wafer optionally coated with a thermal oxide film or a silicon nitride film. The substrate may be beforehand provided with trenches, holes and/or semiconductor parts formed thereon. There is no particular restriction on the method for forming those trenches, holes and/or semiconductor parts, and hence any known method can be adopted.

On the substrate, a polysilazane composition serving as material of a siliceous film is applied to form a film. The polysilazane composition can be prepared by dissolving a polysilazane compound and a silica-conversion reaction accelerator in a solvent.

The polysilazane compound used in the present invention is not particularly restricted, and hence can be freely selected unless it impairs the effect of the invention. Further, it may be either an inorganic or organic compound. Examples of the inorganic polysilazane compound include: a perhydropolysilazane compound which has a straight-chain structure comprising structural units represented by the following formulas (I)

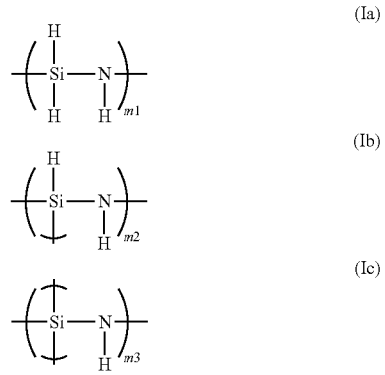

which has a molecular weight of 690 to 2000, which includes 3 to 10 SiH$_3$ groups per molecule thereof, and which contains elements of Si, N and H in elemental ratios of Si: 59 to 61 wt %, N: 31 to 34 wt % and H, 6.5 to 7.5 wt %, respectively, based on chemical analysis; and also another perhydropolysilazane compound which has a standard polystyrene equivalent average molecular weight of 3000 to 20000.

Further, still also included are: a polysilazane compound which has a skeleton mainly comprising a structural unit represented by the following formula (II)

(wherein each of R$^1$, R$^2$ and R$^3$ is independently hydrogen, an alkyl group, an alkenyl group, a cycloalkyl group, an aryl group, an alkylsilyl group, an alkylamino group, an alkoxy group, or another group such as a fluoroalkyl group which contains a carbon atom directly connecting to the silicon atom, provided that at least one of R$^1$, R$^2$ and R$^3$ is hydrogen) and which has a number average molecular weight of about 100 to 50000; and modified compounds thereof. Two or more polysilazane compounds can be used in combination.

In the present invention, the polysilazane composition contains the polysilazane compound in an amount of preferably 0.1 to 40 wt %, more preferably 0.5 to 20 wt %, based on the total weight of the composition. The content of the polysilazane compound is normally adjusted to 0.5 to 20 wt %, and thereby the resultant film can be made to have a preferred thickness, which is, for example, 500 to 8000 Å.

The polysilazane composition used in the present invention contains a solvent capable of dissolving the above polysilazane compound. It should be noted that this solvent maybe not necessarily the same as the solvent of the above polysilazane coat-treatment solution. There is no particular restriction on the solvent as long as it can dissolve the above components. Preferred examples of the solvent include:

(a) aromatic compounds, such as benzene, toluene, xylene, ethylbenzene, diethylbenzene, trimethylbenzene and triethylbenzene; (b) saturated hydrocarbon compounds, such as n-pentane, i-pentane, n-hexane, i-hexane, n-heptane, i-heptane, n-octane, i-octane, n-nonane, i-nonane, n-decane and i-decane; (c) alicyclic hydrocarbon compounds, such as ethylcyclohexane, methylcyclohexane, cyclohexane, cyclohexene, p-menthane, decahydronaphthalene, dipentene and limonene; (d) ethers, such as dipropyl ether, dibutyl ether, diethyl ether, methyl tertiary butyl ether (hereinafter, referred to as MTBE) and anisole; and (e) ketones, such as methyl isobutyl ketone (hereinafter, referred to as MIBK). Among them, more preferred are (b) saturated hydrocarbon compounds, (c) alicyclic hydrocarbon compounds, (d) ethers and (e) ketones.

Those solvents can be used in combination of two or more, so as to control the evaporation rate, to reduce the hazardousness to the human body and to control the solubility of the components.

In the present invention, the polysilazane composition further contains a silica-conversion reaction accelerator. Here, the accelerator is a compound having a function of interacting with the polysilazane compound to accelerate a reaction in which the polysilazane compound is converted into a siliceous substance. There are already known various compounds usable as the accelerators, and, for example, those described in Patent documents 4 to 6 can be employed in the present invention. Specifically, examples of the accelerators include the following compounds of (i) to (iii).

(i) Metal carboxylates are a kind of the accelerators. Particularly preferred is a metal carboxylate containing nickel, titanium, platinum, rhodium, cobalt, iron, ruthenium, osumium, palladium, iridium or aluminum. When the metal carboxylate is incorporated as the accelerator, the content thereof is generally 0.01 to 20 wt %, preferably 0.1 to 10 wt %, more preferably 0.5 to 5 wt %, based on the weight of the polysilazane compound. If the metal carboxylate is added in an amount more than the above range, the composition may undergo gelation. On the other hand, if the content is too small, it is often impossible to obtain the effect of the invention. Accordingly, it is necessary to pay attention to the content thereof.

(ii) N-heterocyclic compounds are another kind of the accelerators. Preferred is non-aromatic N-heterocyclic compounds.

Examples of them include 1,3-di-4-piperidylpropane, 4,4'-trimethylenebis(1-methyl piperidine), diazabicyclo-[2.2.2]octane and cis-2,6-dimethylpiperazine.

When the N-heterocyclic compound is incorporated as the accelerator, the content thereof is generally 0.01 to 50 wt %, preferably 0.1 to 10 wt %, based on the weight of the polysilazane compound. The silica-conversion reaction is accelerated in accordance with increase of the content. From that point of view, the N-heterocyclic compound is preferably contained in a large amount. On the other hand, however, if the content is too large, the resultant siliceous film may have poor density and/or the polysilazane compound may become unstable to lower treatability of the composition. Accordingly, it is necessary to pay attention to the content thereof.

(iii) Amine compounds are still another kind of the accelerators. Examples of them include an amine compound represented by the following formula (A) or (B), namely:

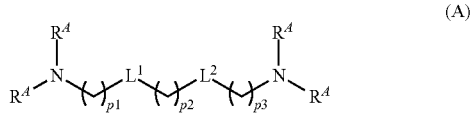

(A)

(wherein each $R^A$ is independently hydrogen or a hydrocarbon group of $C_1$ to $C_3$ provided that two $R^A$s connecting the same nitrogen are not both hydrogens at the same time; each of $L^1$ and $L^2$ is independently —$CH_2$—, —O— or —$NR^{41}$— in which $R^{41}$ is hydrogen or a hydrocarbon group of $C_1$ to $C_4$; each of p1 and p3 is independently an integer of 0 to 4; and p2 is an integer of 1 to 4)

or

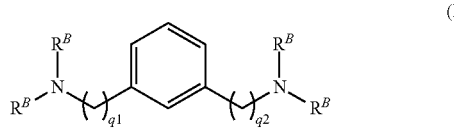

(B)

(wherein each $R^B$ is independently hydrogen or a hydrocarbon group of $C_1$ to $C_4$; and each of q1, and q2 is independently an integer of 1 to 4).

The composition contains the amine compound in an amount of generally 50 wt % or less, preferably 10 wt % or less, based on the weight of the polysilazane compound. Particularly in the case where a perhydropolysilazane compound, which contains silicon atoms not connecting to alkyl groups, is used as the polysilazane compound, the amine compound has an electronic or stereochemical advantage and hence works so efficiently that the effect of the present invention can be obtained even if the content thereof is relatively small. Specifically, the amine compound is incorporated in an amount of generally 1 to 20 wt %, preferably 3 to 10 wt %, more preferably 4 to 8%, further preferably 4 to 6%. The content of the amine compound is preferably more than a particular amount so as to obtain the maximum effects of accelerating the reaction and of improving the film density. However, in order to keep compatibility of the composition and to avoid coating ununiformity or failure in film-forming, the content is preferably less than another particular amount.

The polysilazane composition used in the present invention can contain other additives, if necessary. Examples of the optional additives include crosslinking accelerators and viscosity modifiers. Further, when used for producing a semiconductor devise, the composition can contain a phosphorus compound such as tris(trimethylsilyl)phosphate for the sake of Na-gettering effect.

As the polysilazane composition described above, it is also possible to employ those disclosed in Patent documents 4 to 6, for example.

The above polysilazane composition is applied on The substrate according to known methods, such as spin coating, dip coating, spray coating, print-transfer coating and the like. Among them, spin coating is particularly preferred.

(b) Step for Application of Polysilazane Film-Treatment Solution

Subsequently, the polysilazane film formed on the substrate surface may be then subjected to preliminary heating (pre-baking) to remove (to dry) excess organic solvent from the film, if necessary. After that, the above-described polysilazane film-treatment solution is applied thereon. The preliminary heating does not aim to harden the polysilazane, and hence is carried out generally at a low temperature for a short time, for example, at 70 to 150° C., preferably 100 to 150° C., and for 1 to 10 minutes, preferably 3 to 5 minutes.

There is no particular restriction on the method for applying the treatment solution, which may be applied by spray coating, spin coating, bar coating, flow coating or hand coating.

(c) Hardening Step

After the step for application of the treatment solution, the film is subjected to the hardening step. In the siliceous film formation method according to the present invention, the hardening step is carried out at a temperature of 300° C. or less. The polysilazane compound is converted into silica and accordingly the film is hardened at a very low temperature by the cooperative action of the accelerator in the polysilazane composition and hydrogen peroxide in the treatment solution. This means that a curing procedure, which is indispensable in conventional methods, is unnecessary in the present invention. Even when the curing is carried out, the temperature thereof is, for example, 300° C. or less. It is particularly preferred to harden the film at room temperature because that hardening step does not need energy and facilities necessary for the curing procedure and, as a result, the production process can be simplified. Further, even if the process includes the curing procedure, energy for curing and time for heating and cooling are reduced. Consequently, the present invention improves the productivity.

The hardening step is preferably carried out in an atmosphere containing steam, oxygen or mixed gas thereof, namely, in an oxidative atmosphere. In the present invention, it is particularly preferred to harden the film in an atmosphere containing oxygen. The amount of oxygen is preferably not less than 1 volume %, more preferably not less than 10 volume %. The atmosphere may contain inert gases such as nitrogen and helium unless they impair the effect of the present invention.

If this step is carried out in a steam-containing atmosphere, the amount of steam is preferably not less than 0.1 volume %, more preferably not less than 1 volume %. In the present invention, it is particularly preferred to harden the film in a mixed gas atmosphere containing steam and oxygen.

The present invention is further explained below by use of the following examples.

Preparation of Polysilazane Composition

The following three polysilazane compositions were prepared.

(X) Into perhydropolysilazane, tetramethylhexanediamine was added in an amount of 5 wt % based on the weight of perhydropolysilazane. The mixture was then diluted with dibutyl ether, to prepare a composition in which the concentration of perhydropolysilazane was 10 wt %.

(Y) Into perhydropolysilazane, 4,4'-trimethylene bis(1-methylpiperidine) was added in an amount of 5 wt % based on the weight of perhydropolysilazane. The mixture was then diluted with dibutyl ether, to prepare a composition in which the concentration of perhydropolysilazane was 10 wt %.

(Z) Palladium propionate was added into perhydro polysilazane in an amount of 1 wt % based on the weight of perhydropolysilazane, to prepare a composition in which the concentration of perhydropolysilazane was 10 wt %.

Preparation of Polysilazane Film-Treatment Solution

Successively, polysilazane film-treatment solutions shown in Table 1 were individually prepared by use of a 30 wt % aqueous solution of hydrogen peroxide, an alcohol and water. It should be noted that peroxide and an alcohol were not used in Comparison Examples 4 and 5, respectively, to prepare treatment solutions. Further, organic solvents were incorporated in place of alcohols to prepare treatment solutions in Comparison Examples 6 to 8.

Formation of Siliceous Film

On a 4-inch silicon wafer, 1 cc of each polysilazane composition was dropped and spin-coated to form a polysilazane film. In this spin-coating procedure, the wafer was rotated at 500 rpm for 5 seconds, and then further rotated at 1000 rpm for 20 seconds. Thereafter, each polysilazane coat-treatment solution absorbed in a nonwoven fabric was applied by hand-coating on the formed polysilazane coat at room temperature and a relative humidity of 40 to 55%. In each of Examples 1 to 19 and Comparative Examples 1 to 10, the coat was then left to harden for 5 minutes under the same environmental conditions. On the other hand, in each of Example 20 and Comparative Example 11, the polysilazane film was cured at 80° C. for 30 minutes before the treatment solution was applied thereon, and further the film was cured again at 80° C. for 30 minutes after the treatment, to harden the film.

Evaluation on Degree of Silica-Conversion in Siliceous Film

The degree of silica-conversion was evaluated by means of FT-IR measurement system. Specifically, IR spectra of the composition were measured before and after the conversion, to estimate how much the composition was converted into siliceous substance. The siliceous film obtained by the conversion generally exhibited an IR spectrum having peaks at 1030 cm$^{-1}$ and 450 cm$^{-1}$, which were attributed to absorption by Si—O bond. On the other hand, however, the IR spectrum of the siliceous film had neither peaks at 3350 cm$^{-1}$ and 1200 cm$^{-1}$, which were attributed to absorption by N—H bond, nor a peak at 2200 cm$^{-1}$, which was attributed to absorption by Si—H bond, although those peaks were observed in the spectrum before the conversion. It was therefore possible to estimate how much the film was converted into a siliceous film according to the spectra. Based on the above characteristics of the IR spectra, each formed film was evaluated on the degree of silica-conversion and classified into the following grades:

A: a fully silica-converted film, in the spectrum of which absorption peaks attributed to Si—H and Si—N bonds were hardly observed;

B: an insufficiently silica-converted film, in the spectrum of which an absorption peak attributed to Si—O bond was observed but a peak attributed to Si—H bond was also observed; and C: a scarcely silica-converted film, whose IR spectrum was almost the same as that of perhydropolysilazane.

The results were shown in Table 1. Only the siliceous film formed in Comparative Example 5 was observed to have teardrop-shaped stains on the surface.

Evaluation on Contact Angle of Siliceous Film Against Water

Water was dropped onto each formed film, to measure the contact angle. The results were shown in Table 1.

TABLE 1

| | polysilazane composition kind | polysilazane film-treatment solution | | | siliceous film | |
|---|---|---|---|---|---|---|
| | | H$_2$O$_2$ content (wt %) | alcohol kind | content (wt %) | degree of silica-conversion | contact angle against water (°) |
| Ex. 1 | X | 10 | Et | 50 | A | 5 |
| Ex. 2 | X | 8.0 | Et | 50 | A | 5 |
| Ex. 3 | X | 5.0 | Et | 50 | A | 5 |
| Ex. 4 | X | 3.0 | Et | 50 | A | 8 |
| Ex. 5 | X | 1.0 | Et | 50 | A | 7 |
| Ex. 6 | X | 0.5 | Et | 50 | A | 10 |
| Ex. 7 | X | 5.0 | Me | 20 | A | 8 |
| Ex. 8 | X | 5.0 | Bu | 25 | A | 8 |
| Ex. 9 | X | 5.0 | Hx | 75 | A | 8 |
| Ex. 10 | X | 5.0 | Oc | 75 | A | 7 |
| Ex. 11 | X | 5.0 | PG | 10 | A | 8 |
| Ex. 12 | X | 5.0 | EG | 75 | A | 5 |
| Ex. 13 | X | 5.0 | MPr | 83 | A | 5 |
| Ex. 14 | X | 4.0 | EEt | 25 | A | 9 |
| Ex. 15 | X | 3.0 | PG/Me | 20/40 | A | 7 |
| Ex. 16 | X | 2.0 | MPr/Et | 25/25 | A | 8 |
| Ex. 17 | X | 1.0 | EG/EEt | 10/88 | A | 8 |
| Ex. 18 | X | 0.5 | Et/Oc | 70/5 | A | 12 |
| Ex. 19 | Y | 3.0 | Et | 30 | A | 10 |
| Ex. 20 | Z | 5.0 | Et | 70 | A | 7 |
| Com. 1 | X | 0.4 | Et | 50 | B | 45 |
| Com. 2 | X | 0.3 | Et | 50 | B | 52 |
| Com. 3 | X | 0.05 | Et | 50 | B | 68 |
| Com. 4 | X | — | Et | 50 | B | 82 |

TABLE 1-continued

| | polysilazane film-treatment solution | | | | siliceous film | |
|---|---|---|---|---|---|---|
| | polysilazane | $H_2O_2$ | alcohol | | | contact angle |
| | composition kind | content (wt %) | kind | content (wt %) | degree of silica-conversion | against water (°) |
| Com. 5 | X | 5.0 | — | — | C | 65 |
| Com. 6 | X | 5.0 | DBE | 50 | C | 80 |
| Com. 7 | X | 5.0 | Xy | 50 | C | 86 |
| Com. 8 | X | 5.0 | D40 | 50 | C | 88 |
| Com. 9 | X | | not treated | | C | 85 |
| Com. 10 | Y | | not treated | | C | 88 |
| Com. 11 | Z | | not treated | | C | 79 |

Remarks)
Et: ethanol
Me: methanol
Bu: butanol
Hx: hexanol
Oc: octanol
PG: propylene glycol
EG: ethylene glycol
MPr: 1-methoxy-2-propanol
EEt: 2-ethoxyethanol
DBE: dibutyl ether
Xy: xylene
D40: exxsol D40 ([trademark], manufactured by EXXON Mobil Corporation), a petroleum solvent whose main components are saturated hydrocarbons having 9 to 11 carbon atoms Evaluation on Wet Etching Rate of Siliceous Film With respect to the films formed in Examples 3 and 20 and Comparative Examples 9 and 11, the wet etching rates were evaluated. Specifically, each film was immersed in a 0.5% hydrogen fluoride aqueous solution, and it was measured how fast the film was getting thinner. The results were shown in Table 2.

TABLE 2

| | wet etching rate (Å/min) |
|---|---|
| Ex. 3 | 859 |
| Ex. 20 | 324 |
| Com. 9 | >10000 |
| Com. 11 | 5066 |

The invention claimed is:

1. A siliceous film formation method comprising
a polysilazane-film formation step, in which a composition comprising a polysilazane compound and a silica-conversion reaction accelerator is applied, by spin coating, on a substrate surface to form a polysilazane film;
a promoter application step, in which a polysilazane film-treatment solution is applied by casting on said polysilazane film; and
a hardening step, in which said polysilazane compound is converted into a siliceous film at a temperature of 300° C. or less;
wherein
said polysilazane film-treatment solution comprises a solvent, 0.5 to 10 wt% of hydrogen peroxide and 25 to 98 wt% of an alcohol, based on the total weight thereof.

2. The siliceous film formation method according to claim 1, wherein said polysilazane compound is a perhydropolysilazane compound.

3. The siliceous film formation method according to claim 1, wherein said silica-conversion reaction accelerator is selected from a metal carboxylate, a N-heterocyclic compound and an amine compound.

4. The siliceous film formation method according to claim 1, wherein said alcohol is selected from the group consisting of monools, diols and oxyethers.

5. The siliceous film formation method according to claim 1, wherein said solvent is water.

6. The siliceous film formation method according to claim 1, wherein said hardening step is carried out at room temperature.

7. A polysilazane film-treatment solution
which is applied on a polysilazane film formed by applying, by spin coating, a composition containing a polysilazane compound and a silica-conversion reaction accelerator, so as to promote conversion of the polysilazane compound into silica;
characterized by comprising a solvent, 0.5 to 10 wt% of hydrogen peroxide and 25 to 98 wt% of an alcohol, based on the total weight thereof.

8. The method of claim 1, where the alcohol can have 1 to 8 carbon atoms.

9. The composition of claim 7, where the alcohol is selected from the group consisting of monools, diols and oxyethers.

10. The composition of claim 7, where the alcohol can have 1 to 8 carbon atoms.

11. The composition of claim 7, where the solvent is water.

12. The composition of claim 7, where the alcohol is selected from methanol, ethanol, n-propanol, iso-propanol, butanol, hexanol octanol, ethylene glycol, propylene glycol, 1-methoxy-2-propanol, 2-ethoxyethanol and mixtures thereof.

13. The method of claim 1, where the alcohol is selected from methanol, ethanol, n-propanol, iso-propanol, butanol, hexanol octanol, ethylene glycol, propylene glycol, 1-methoxy-2-propanol, 2-ethoxyethanol and mixtures thereof.

* * * * *